United States Patent [19]
Bliss

[11] Patent Number: 5,642,243
[45] Date of Patent: Jun. 24, 1997

[54] TIMING RECOVERY FREQUENCY ERROR DETECTOR FOR SAMPLED AMPLITUDE MAGNETIC RECORDING

[75] Inventor: William G. Bliss, Thornton, Colo.

[73] Assignee: Cirrus Logic, Inc., Fremont, Calif.

[21] Appl. No.: 521,145

[22] Filed: Aug. 29, 1995

Related U.S. Application Data

[62] Division of Ser. No. 313,491, Sep. 27, 1994.

[51] Int. Cl.$^6$ .................................. G11B 5/00; G11B 5/09
[52] U.S. Cl. .................................. 360/51; 360/32
[58] Field of Search .................................. 360/32, 40, 51; 375/294, 355, 375, 376

[56] References Cited

U.S. PATENT DOCUMENTS

| | | |
|---|---|---|
| 4,970,609 | 11/1990 | Cunningham et al. . |
| 5,311,178 | 5/1994 | Pan et al. . |
| 5,359,631 | 10/1994 | Behrens et al. ................. 375/120 |
| 5,406,427 | 4/1995 | Shimoda . |
| 5,416,806 | 5/1995 | Coker et al. . |
| 5,459,757 | 10/1995 | Minuhin et al. . |
| 5,465,059 | 11/1995 | Pan et al. . |
| 5,511,098 | 4/1996 | Gardner ................. 374/340 |

FOREIGN PATENT DOCUMENTS 0-557-856   9/1993   European Pat. Off. .

*Primary Examiner*—Aristotelis Psitos
*Assistant Examiner*—Regina Y. Neal
*Attorney, Agent, or Firm*—Howard H. Sheerin

[57] ABSTRACT

In a synchronous read channel for magnetic recording, a timing recovery phase-locked loop (PLL) comprises an improved discrete time frequency error detector for locking the PLL to a sinusoidal reference signal. The sinusoidal reference signal is sampled, and a frequency error is computed using three sample values which span more than half a period of the reference signal. Consequently, the frequency error detector is not affected by a DC offset in the reference signal, and it is less susceptible to noise due to an increase in sensitivity.

4 Claims, 10 Drawing Sheets

TIMING RECOVERY FREQUENCY ERROR DETECTOR FOR SAMPLED AMPLITUDE MAGNETIC RECORDING

This application is a divisional of application Ser. No. 08/313,491, filed Sep. 27th, 1994 now pending.

FIELD OF INVENTION

The present invention relates to computer technology and, more specifically, to timing recovery systems for retrieving digitized data from magnetic storage mediums utilizing partial response waveform sampling techniques.

CROSS REFERENCE TO RELATED APPLICATIONS AND PATENTS

This application is related to other co-pending U.S. patent applications, namely application Ser. No. 08/222,666 entitled "Spectral Smoothing Filter," and 08/087,617 entitled "Channel Quality." This application is also related to several U.S. patents, namely U.S. Pat. No. 5,291,499 entitled "Method and Apparatus for Reduced-Complexity Viterbi-Type Sequence Detectors," U.S. Pat. No. 5,297,184 entitled "Gain Control Circuit for Synchronous Waveform Sampling," U.S. Pat. No. 5,329,554 entitled "Digital Pulse Detector," U.S. Pat. No. 5,359,631 entitled "Timing Recovery Circuit for Synchronous Waveform Sampling," and U.S. Pat. No. 5,424,881 entitled "Synchronous Read Channel." All of the above-named patent applications and patents are assigned to the same entity, and all are incorporated herein by reference.

BACKGROUND OF THE INVENTION

In magnetic storage systems, a transducing head writes digital data onto a magnetic storage medium. The digital data serves to modulate the current in the head coil so that a sequence of corresponding magnetic flux transitions are written onto the medium. To read this recorded data, the head passes over the medium and transduces the magnetic transitions into pulses in an analog signal. These pulses are then decoded by the read channel circuitry to reproduce the digital data.

Decoding the pulses into a digital sequence can be performed by a simple pulse detector read channel or, as in more recent designs, by using a Partial Response Maximum Likelihood (PRML) read channel. The PRML read channel scheme is preferred over the simpler pulse detection scheme because it decreases the necessary bandwidth. Thus, more data can be stored on the storage medium.

In conventional peak detection schemes, threshold crossing or derivative information implemented in analog circuitry is normally used to detect peaks in the continuous time analog signal generated by the read head. The analog signal is then interpreted at specific bit cell periods. The presence of a peak during the bit cell period is detected as a "1" bit, and the absence of a peak is detected as a "0" bit. Timing recovery adjusts the bit cell periods so that the peaks occur in the center of the bit cells. Errors occur when the bit cells are not correctly aligned with the analog pulse data. Since timing information is derived only when peaks are detected, the input data stream is normally run length limited (RLL) (encoded to limit the number of consecutive "0" bits.)

Intersymbol interference (ISI), due to closely spaced pulses, can cause the peaks to shift from one bit cell to another, resulting in errors when detected. To reduce the effect of ISI, an encoding scheme is employed to ensure that a minimum number of "0" bits occur between "1" bits. For example, a (d,k) run length limited (RLL) code constrains the minimum number of "0" bits between "1" bits to d, and the maximum number of consecutive "0" bits to k. A typical RLL code is a (1,7) 2/3 rate code which encodes 8 bit data words into 12 bit codewords to satisfy the (1,7) constraint. However, the d=1 constraint has the undesirable effect of decreasing the data density due to the decreased bandwidth.

Another technique used to record data, known as Partial Response Maximum Likelihood recording (herein after PRML), increases the data density by compensating for intersymbol interference, thereby obviating the d constraint. Unlike conventional peak detection systems, PRML recording detects digital data by interpreting, at discrete time periods, the actual value of the pulse data. Thus, the analog pulses are sampled at the baud rate and the digital data is detected from these discrete time sample values. This allows for a coding constraint of (0,k) (typically (0,4) 8/9 rate coding) which increases the data density.

The application of Partial Response Maximum Likelihood techniques to digital communication channels is well documented. See Y. Kabal and S. Pasupathy, "Partial Response Signaling", *IEEE Trans. Commun. Tech.*, Vol. COM-23, pp.921–934, Sep. 1975; and Edward A. Lee and David G. Messerschmitt, "Digital Communication", Kluwer Academic Publishers, Boston, 1990; and G. D. Forney, Jr., "The Viterbi Algorithm", *Proc. IEEE*, Vol. 61, pp. 268–278, March 1973. Applying PRML techniques to magnetic storage systems is also well documented. See Roy D. Cideciyan, Francois Dolivo, Walter Hirt, and Wolfgang Schott, "A PRML System for Digital Magnetic Recordin", *IEEE Journal on Selected Areas in Communications*, Vol. 10 No. 1, January 1992, pp.38–56; and Wood et al, "Viterbi Detection of Class IV Partial Response on a Magnetic Recording Channel", *IEEE Trans. Commun.*, Vol. Com-34, No. 5, pp. 454–461, May 1986; and Coker Et al, "Implementation of PRML in a Rigid Disk Drive", *IEEE Trans. on Magnetics*, Vol. 27, No. 6, November 1991.

Similar to conventional peak detection systems, PRML recording requires timing recovery in order to correctly extract the digital sequence. However, rather than utilizing the continuous analog signal to align peaks to the center of bit cell periods, as in peak detection systems, PRML systems synchronize the sampling of the pulses according to estimated sample values. The sample values can be estimated even in the presence of ISI, and together with the actual signal sample values, used to synchronize the sampling of the analog pulses in a decision-directed feedback system.

Normally, a phase-locked loop (PLL) circuit controls the timing recovery in PRML recording. A phase detector processes the signal samples to generate a phase error between the actual and desired frequency. This phase error operates to adjust the sampling frequency which is typically the output of a variable frequency oscillator (VFO) with the phase error as the control input. The output of the VFO controls the sampling period of an analog-to-digital (A/D) converter. It is necessary to first lock the PLL to a reference or nominal sampling frequency so that the desired sampling frequency, with respect to the analog pulses representing the digital data, can be acquired and tracked.

One technique for locking the PLL to a reference frequency is disclosed in U.S. patent application Ser. No. 07/954,350, which is assigned to the same entity as this application. This technique, as shown in FIG. 2A, injects into the A/D converter a sinsusoidal signal at one fourth the nominal sampling frequency. A frequency error, computed from three sample values ($fe=-Sgn(Y_N-1)*(Y_n+Y_n-2)$), controls the VFO to lock its frequency to the nominal sampling frequency. As shown in FIG. 2B, if the sampling frequency is too fast, the frequency error control signal $fe$ is negative and the frequency decreases. If the sampling frequency is too slow, $fe$ is positive, as shown in FIG. 2C, and the frequency increases.

The problem with this technique is that the PLL will not lock to the correct reference frequency if there is a DC offset in the sinusoidal signal. Further, the sensitivity is low because only half of a period of the sinusoidal signal is used to compute the frequency error. As a result, this technique is susceptible to errors due to noise in the channel and quantization.

There are also prior art techniques for acquiring and tracking the sampling frequency. These schemes are based on a timing gradient computed from the actual signal samples and estimated signal samples obtained from symbol-by-symbol decisions. See "Timing Recovery in Digital Synchronous Receivers" by K. H. Mueller and M. Mueller, *IEEE Transactions on Communications*, Vol.Com-24 (1976), pp. 516–531. However, the prior art techniques have drawbacks which are overcome by the present invention. One inherent drawback is that during acquisition the sampling point may occur at the point halfway between the desired sampling times. Consequently, the method for correcting the phase may reverse its direction of adjustment several times in the vicinity of this unstable equilibrium point for an extended period of time. Although this "hang-up" effect does not frequently occur, the length of the acquisition preamble must be sufficiently long so that the system may still synchronize in this situation. A long preamble reduces the total amount of storage space available for user data.

A method for avoiding the "hang-up" effect in order to reduce the preamble length is disclosed in U.S. Pat. No. 4,890,299, an overview of which is provided in FIG. 3. With this method, a sliding threshold, based on past estimated values ~X(n), introduces a hysteresis effect that makes reversals in timing phase adjustments very unlikely. However, the estimated sample values ~X(n) are reconstructed from the signal sample values Y(n) and are therefore subject to error. Errors in the estimated sample values increase again the necessary length of the acquisition preamble.

A further problem not resolved by the prior art is the non-linear characteristic of the timing gradient circuit when tracking arbitrary user data. Because the method for calculating the timing gradient is based on approximating the slope of the pulses, the gain of the timing gradient circuit varies when tracking arbitrary user data due to inconsistent pulse slopes. This variation in gain results in less than optimum timing recovery.

Thus, it is a general object of the present invention to improve the timing recovery method in synchronous partial response magnetic recording systems. A more specific object is to lock the timing recovery loop to a nominal sampling frequency by a technique not affected by a DC offset in the analog signal. A further object is to increase the sensitivity of the lock to reference process in order to decrease susceptibility to errors caused by noise. Yet another object is to acquire the sampling frequency more efficiently by avoiding errors in reconstructing the estimated sample values, thereby reducing the necessary length of the acquisition preamble. A final object is to reduce the gain variations in the timing gradient computation when tracking arbitrary user data.

SUMMARY OF THE INVENTION

The objects of the present invention are achieved by utilizing an improved method and circuit for implementing timing recovery in a synchronous read channel.

A digital phase-locked loop (PLL), comprising a variable frequency oscillator (VFO), generates the sampling frequency for an analog-to-digital converter (A/D). In order to lock the PLL to a nominal sampling frequency, a sinusoidal signal at one fourth the nominal sampling frequency is injected into the A/D. A frequency error is computed utilizing three sample values which span more than half a period of the sinusoidal signal. This method is unaffected by a DC offset and has an increase in signal-to-noise ratio due to an increase in sensitivity.

After locking the timing recovery loop to the nominal sampling frequency, a special training preamble is used to lock onto the actual sampling phase and frequency. A timing gradient $\Delta t$, computed from the signal sample values and expected sample values corresponding to the known preamble, adjusts the sampling phase and frequency. A state machine generates the expected sample values independent of the signal sample values, except to initialize the state machine to a starting state. Thus, errors in reconstructing estimated sample values inherent in the prior art technique of FIG. 3 are avoided, which significantly reduces the length of the acquisition preamble. This allows for faster, more efficient operation of the storage system.

A timing gradient adjuster circuit improves the reliability while tracking arbitrary user data by smoothing variations in the timing gradient $\Delta t$. This is accomplished by increasing the timing gradient when one of the estimated sample values utilized in computing it is zero. If all of the estimated sample values for computing the timing gradient are zero, then the timing gradient is copied from its prior value. Smoothing the timing gradient reduces variations in gain which results in more effective timing recovery.

These and other features of the present invention will become apparent from the following detailed description of the preferred embodiments, which are disclosed in connection with the accompanying drawings.

DETAILED DESCRIPTION OF THE DRAWINGS

Figure 1:
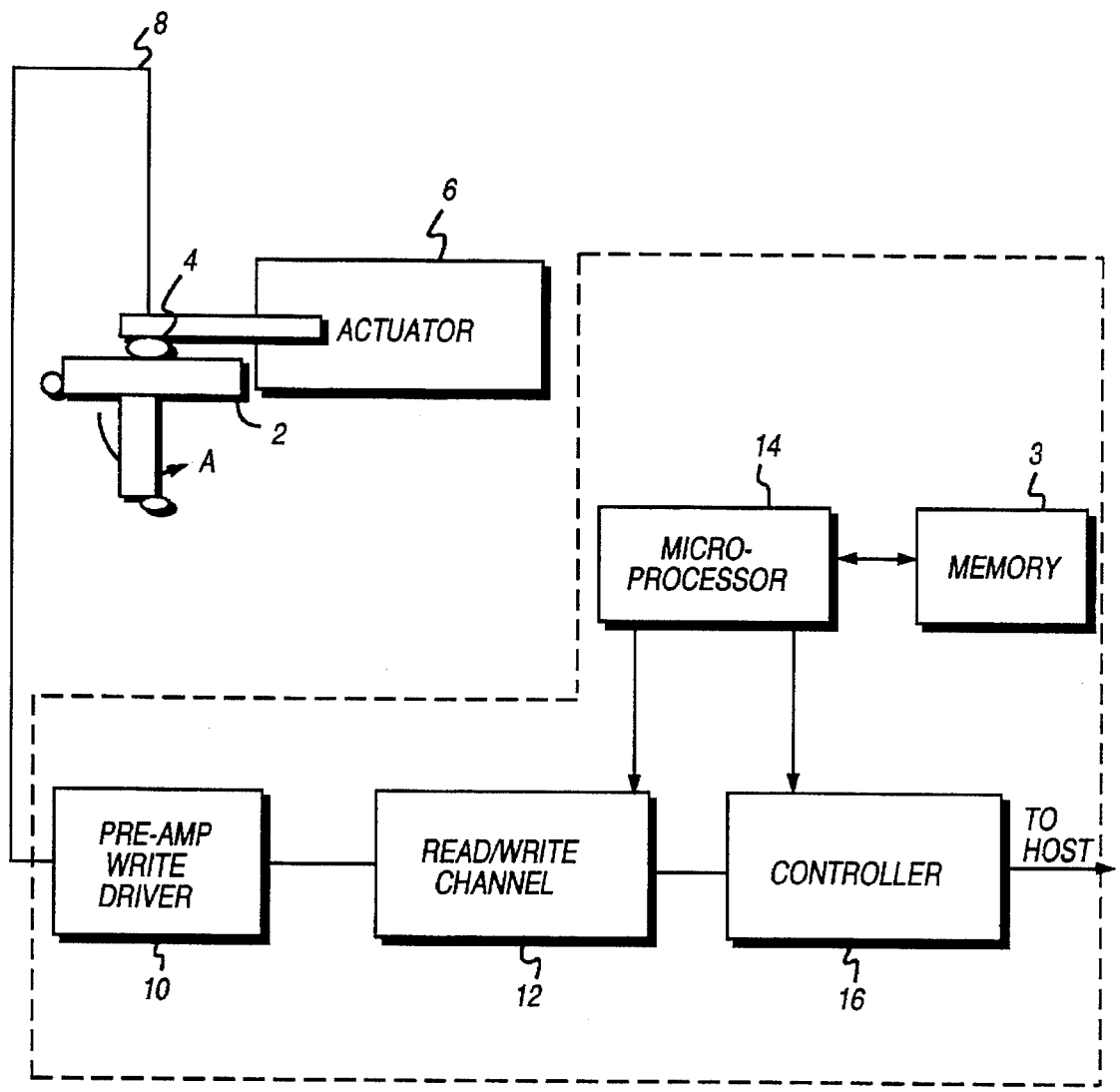
FIG. 1 is an overview of the storage system.
Figure 2A:
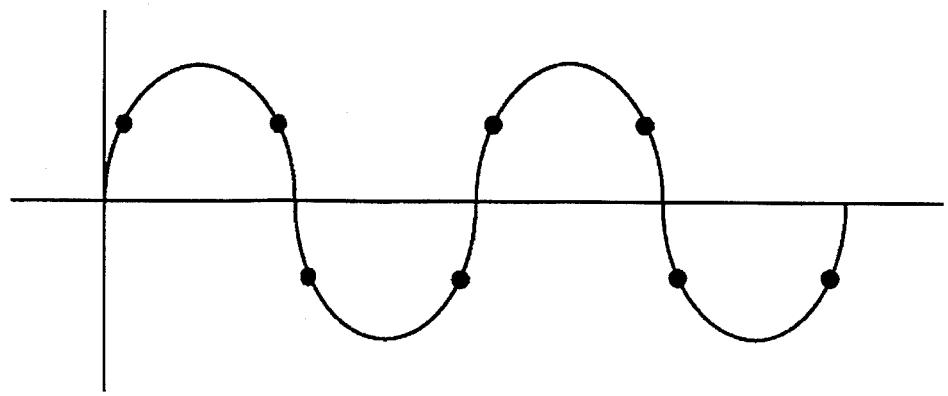
FIG. 2A, 2B, and 2C show a prior art technique for sampling a sine wave to compute the frequency error control signal used to lock the timing recovery PLL to the nominal sampling frequency.
Figure 2B:
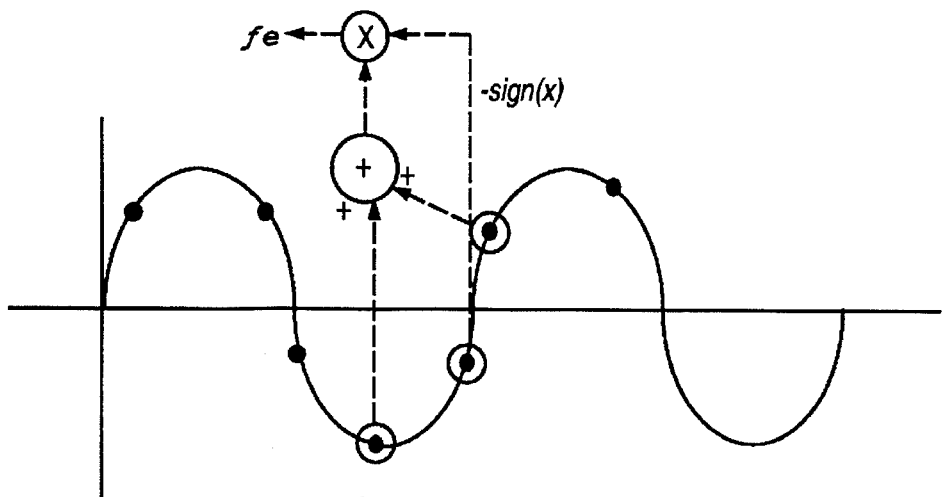
Figure 2C:
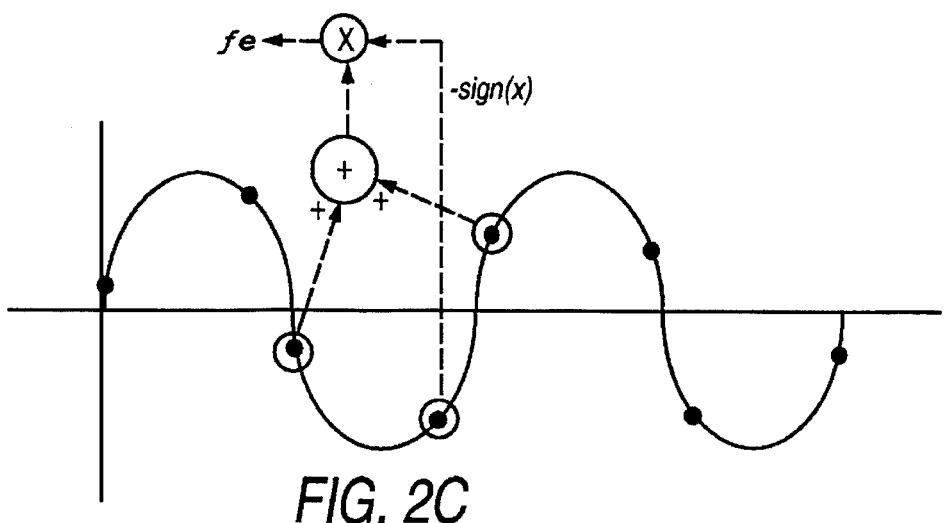
Figure 3:
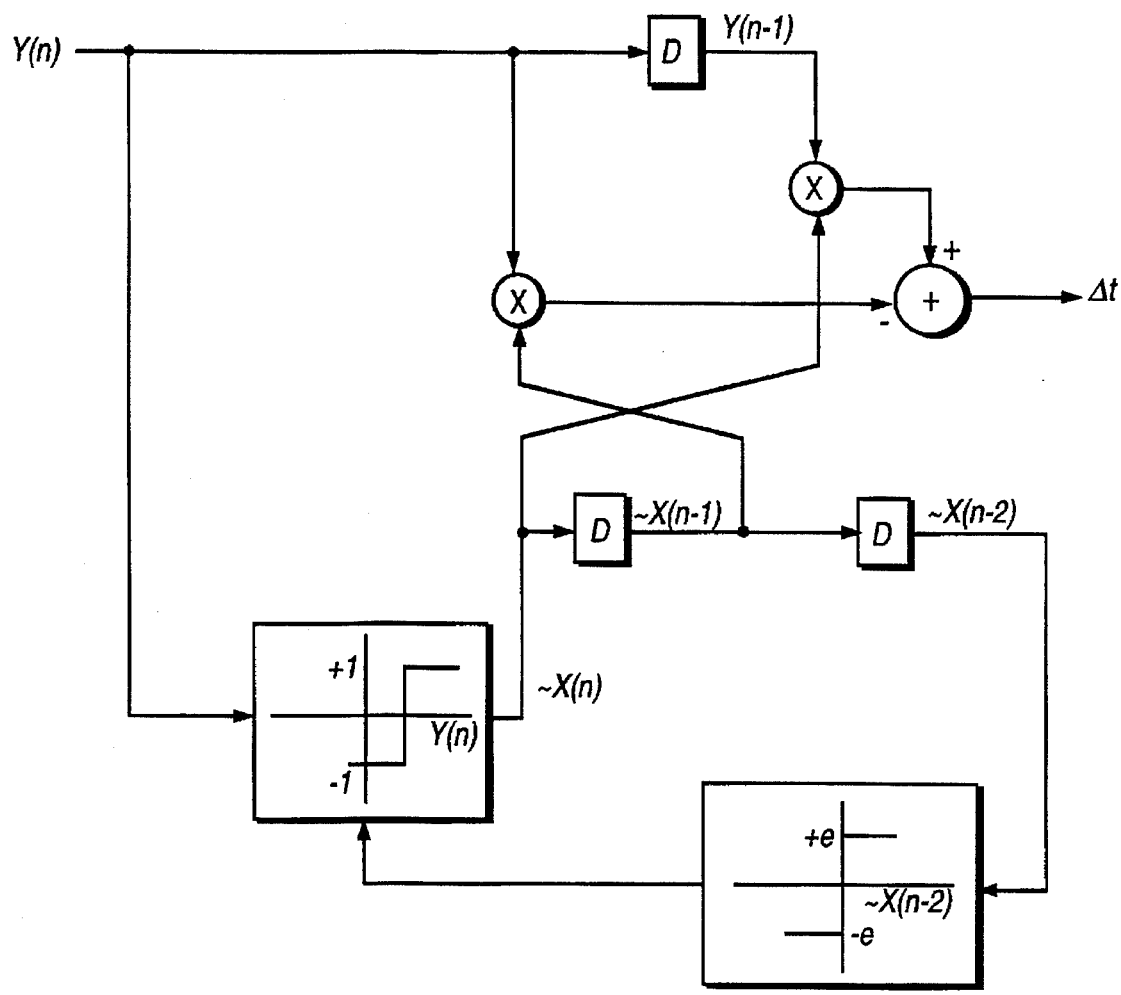
FIG. 3 shows the circuit for generating the timing gradient and a prior art technique for preventing the timing recovery from hanging up when the sampling time is halfway between the desired sampling times (i.e., when $\tau=T/2$).

Referring now in detail to the drawings wherein like characters refer to like elements throughout the various figures, FIG. 1 is an overview of the storage system which has a magnetic read head 4 actuated 6 over a magnetic storage media 2. The read head transduces the magnetic transitions on the magnetic the magnetic media into pulses in an analog signal. The analog pulses are transmitted over line 8 to a pre-amplifier 10 which amplifies the analog pulse data before being processed by the read channel 12. A micro-processor 14 calibrates the read channel and synchronizes data transfers between the read channel 12 and the disk controller 16. The disk controller 16 provides the control and interface between the storage system and a host computer. Memory 3 stores a calibration program and calibration data.

Figure 4:
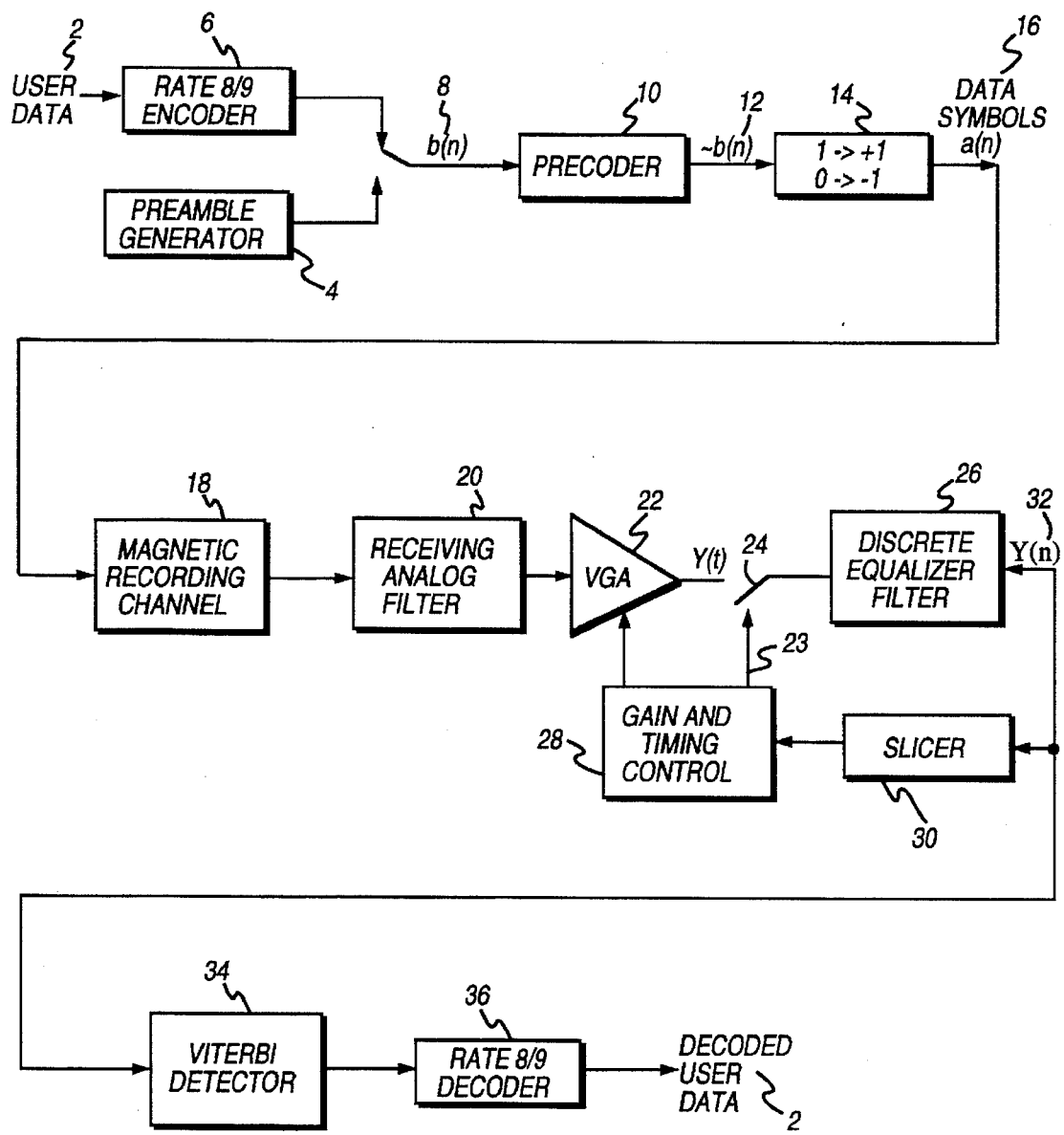
FIG. 4 is a block diagram of the write and read channels.

FIG. 4 is a more detailed block diagram of the PR-IV read/write channel 12. During a write operation, either user data or preamble data 4 for acquiring the sampling frequency is written to the disk drive. The user data 2 is encoded into a binary sequence b(n) 8 by a rate 8/9 encoder 6 according to a (d,k) constraint. The binary sequence b(n) 8 is then precoded 10 by a 1/1-D² filter to compensate for the 1-D² transfer function of the PR-IV recording channel and filters. The precoded sequence ~b(n) 12 is then converted into the data symbols a(n) 16 by translating 14 ~b(n)=0 into a(n)=−1, and ~b(n)=1 into a(n)=+1. The data symbols a(n) modulate the current in the recording head coil at the signaling rate 1/T to record 18 the data symbols onto the magnetic media.

When reading the data symbols back, the combination of an analog receive filter 20, a variable gain amplifier 22, a sampling device 24, and a discrete time filter 26, shape the readback signal to the desired PR format. A decision directed timing recovery scheme 28, utilizing estimated sample values generated by a slicer 30, controls the timing frequency and phase of the sampling device 24 in order to synchronize the equalized samples 32 to the waveform so that the effect of intersymbol interference is minimized. A maximum likelihood (ML) Viterbi sequence detector 34 detects the equalized samples Y(n) 32 to reproduce the data symbols a(n) 16 (assuming no errors). The data symbols a(n) 16 are then decoded 36 back into the user data 2.

Figure 5A:
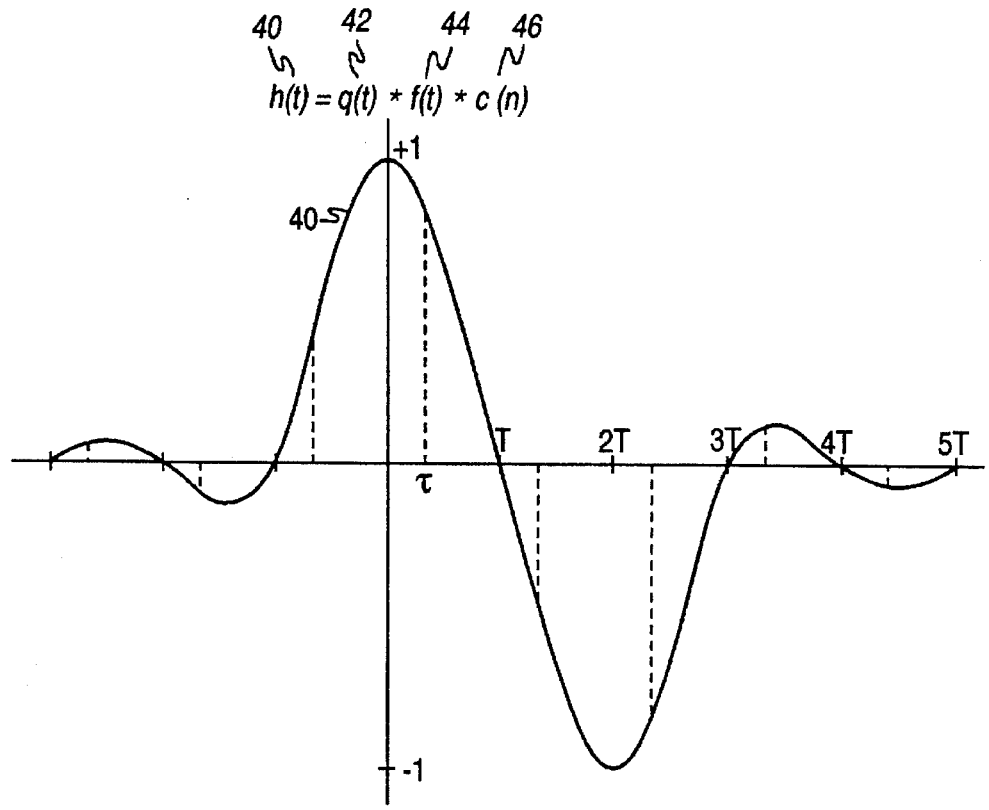
FIG. 5A is the PR-IV response of the combined channel and filters to an isolated input symbol, and illustrates a phase error $\tau$ between the desired and actual sampling phase.
Figure 5B:
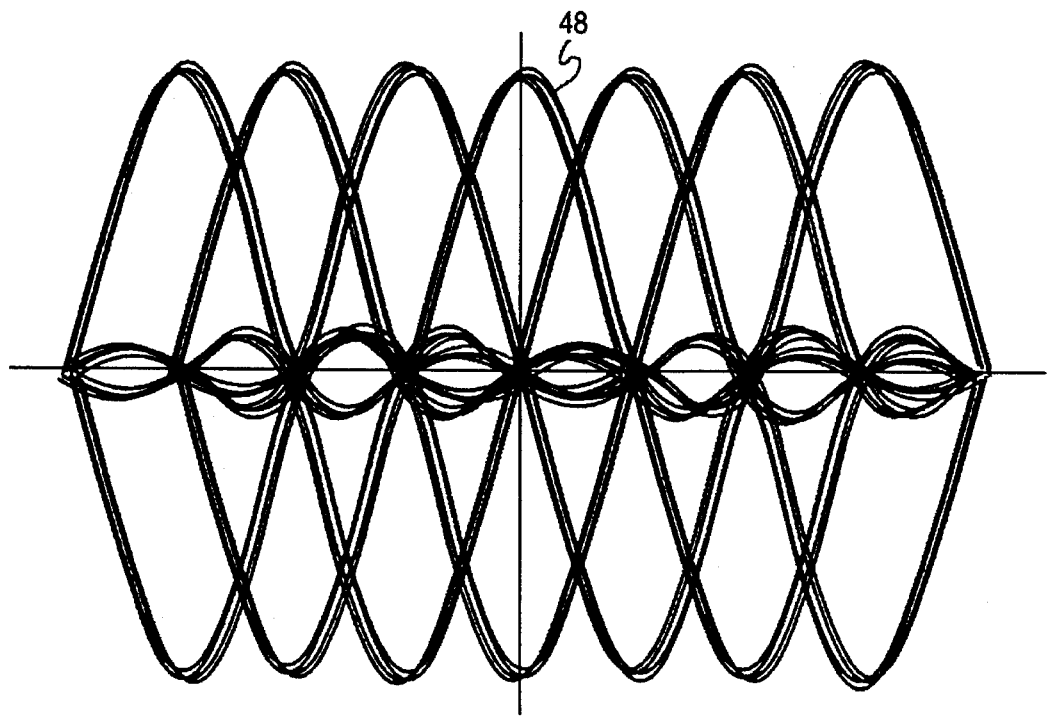
FIG. 5B is the PR-IV response of the combined channel and filters to several symbols, and shows the optimum sampling instance at the opening of the eye diagram.

Referring now to FIG. 5A, shown is the dipulse response h(t) 40 of the combined recording channel q(t) 42, analog filter f(t) 44, and digital filter c(n) 46, to an isolated input symbol a(0)=+1. If the sampling frequency and phase are correct (τ=0), the equalized sample sequence will be {0, 0, +1, 0 −1, 0, 0, ... }. However, if there is a phase error (τ=0), then the equalized sample sequence will be incorrect. For example, the incorrect sequence might be {+0.1, −0.2, +0.4, +0.8, −0.4, −0.8, +0.2, −0.1, ... }. These errors are magnified in the presence of intersymbol interference (ISI). Thus, the object of timing recovery 28 is to adjust the phase error of the sampling frequency to an optimum operating point to minimize the undesirable effect of ISI, and to synchronize the sampling clock to the bit sequence being read. As shown in FIG. 5B, the optimum sampling instance occurs at the opening 48 of the eye diagram where ISI is minimum. In an ideal PR-IV recording channel, the optimum sampling phase is at τ=0.

Figure 6:
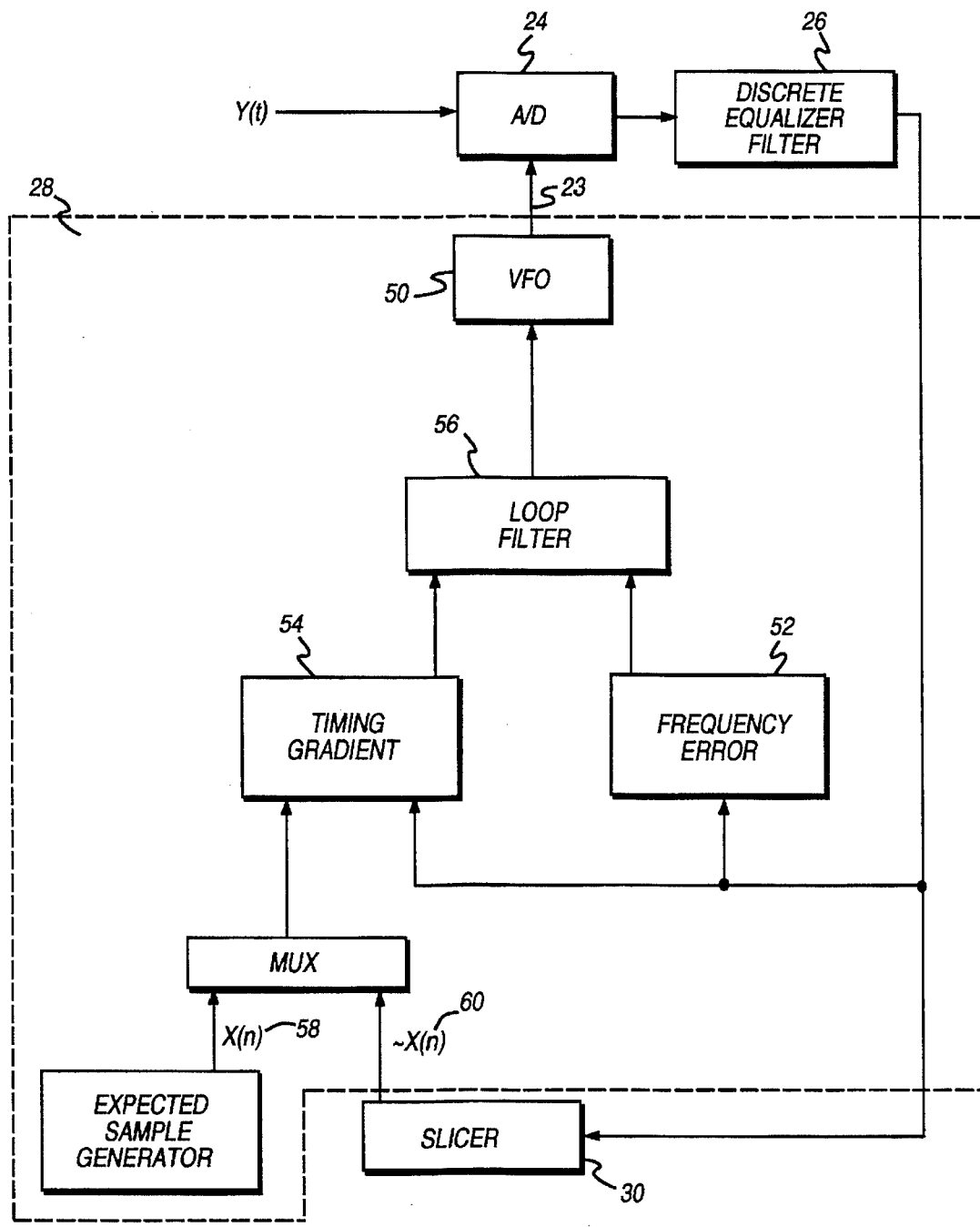
FIG. 6 is a block diagram of the timing recovery circuit of the present invention.

An overview of the timing recovery circuit 28 is shown in FIG. 6. The output 23 of a variable frequency oscillator (VFO) 50 controls the sampling frequency of a sampling device 24 which is typically an analog-to-digital converter (A/D). A frequency error 52 and timing gradient 54 control the frequency of the VFO 50, and a loop filter 56 provides control over the closed loop characteristics. The timing gradient is computed utilizing expected sample values x(n) 58 when acquiring the correct sample phase and frequency, and estimated sample values ~x(n) 60 when tracking user data. Before the timing recovery phase-locked loop (PLL) can acquire the correct sampling phase and frequency, the initial frequency must be within the locking range. This is accomplished by first locking the PLL to a nominal sampling frequency.

Figure 7A:
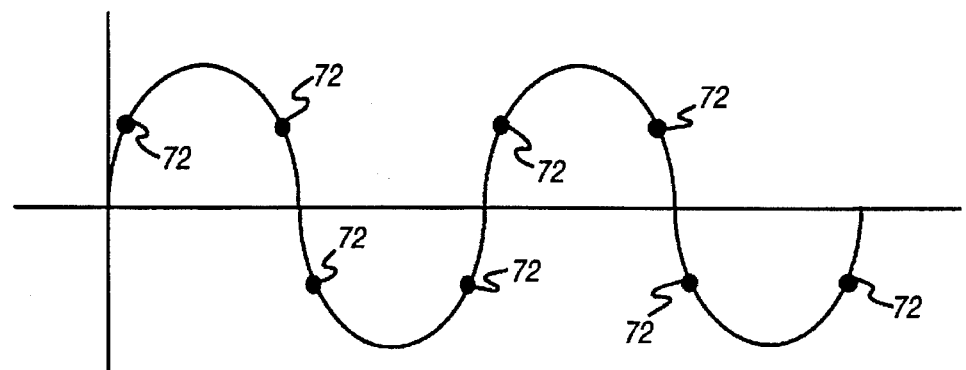
FIG. 7A, 7B, and 7C show the technique of the present invention for sampling a sine wave to compute the frequency error control signal used to lock the timing recovery PLL to the nominal sampling frequency.
Figure 7B:
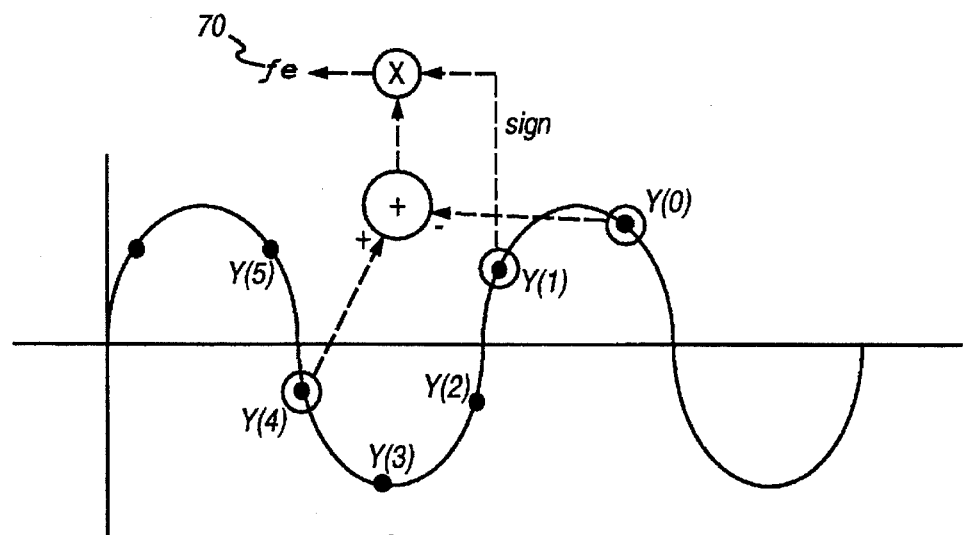
Figure 7C:
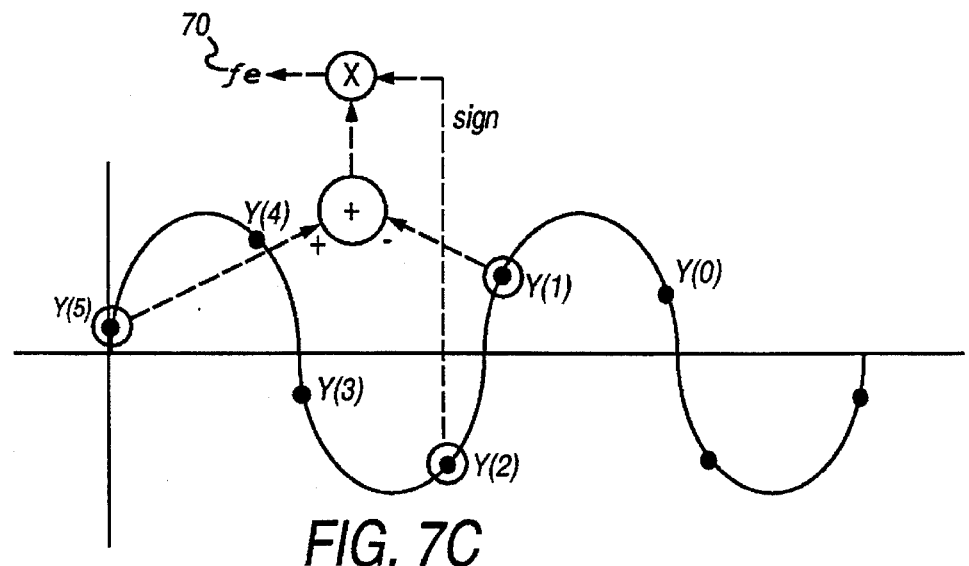

The method of the present invention for locking the PLL to a nominal sampling frequency is shown in FIGS. 7A through 7C. A substantially sinusoidal signal at one quarter the nominal sampling frequency is injected into the sampling device 24. A frequency error $fe$ 70 is computed utilizing the sample values Y(n) according to the following equations:

$$fe = sgn(Y(1)) \cdot (Y(4) - Y(0)) \text{ if } |Y(1)| \geq |Y(2)|;$$

and $$fe = sgn(Y(2)) \cdot (Y(5) - Y(1)) \text{ if } |Y(1)| < |Y(2)|,$$

where Y(0) is the most recent sample value. As shown in FIG. 7A, if the sampling frequency is locked to the nominal sampling frequency, the frequency error $fe$ is zero. If the sampling frequency is too fast, as shown in FIG. 7B, the frequency error $fe$ will be negative, causing the sampling frequency to decrease. Conversely, if the sampling frequency is too slow, as shown in FIG. 7C, the frequency error $fe$ will be positive, causing the sampling frequency to increase.

Because the sample values Y(n) used to compute the frequency error $fe$ span at least a half a period of the reference sine wave, the PLL will lock to the correct frequency even if there is a DC offset in the reference sine wave. Additionally, this method has a higher sensitivity to the frequency error and is therefore less susceptible to noise caused by the channel and quantization.

After the PLL is locked to the nominal reference frequency, a known preamble is transmitted prior to user data in order to lock the PLL onto the actual sampling phase and frequency. A preamble generator 4, connected to the input of the precoder 10, outputs a series of "1" bits to generate a 2T training preamble sequence at the output of the precoder 10 of the form (1,1,0,0,1,1,0,0,1,1,0,0, ... ), which maximizes the magnitude of a PR-IV recording channel.

During acquisition, the 2T preamble is read in either a side or center sample mode to generate a corresponding sample sequence. The two sample sequences, respectively, are:

(+A,+A,−A,−A,+A,+A,−A,−A,+A,+A,−A,−A, ... ) (side sampled)

(+A,0,−A, 0,+A,0,−A,0,+A,0,−A, 0,+A,0, ... ) (center sampled).

Figure 8A:
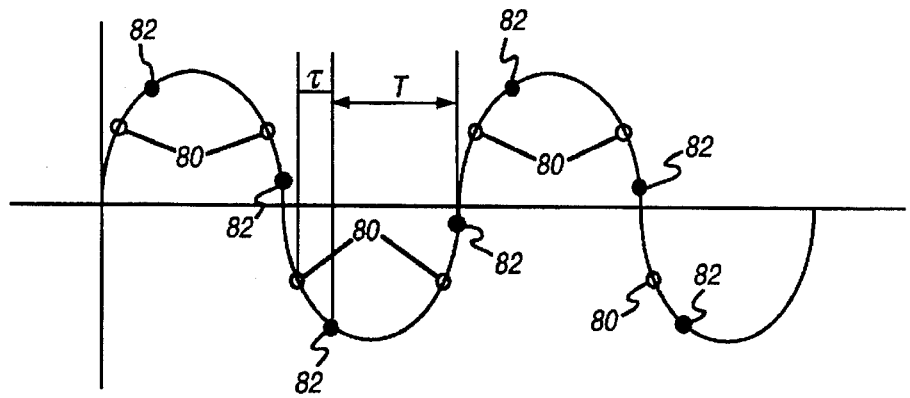
FIG. 8A shows side sampling of a 2T acquisition preamble and the phase error τ in the sampling phase.

FIG. 8A shows the 2T preamble in side-sample mode with the expected samples 80 in relation to the signal samples 82 and a corresponding phase error τ 84. To adjust the initial sampling timing phase, a timing gradient is computed which minimizes the mean squared error between signal sample values and expected sample values. The timing gradient value Δt 86 is computed as:

$$\Delta t(n) = Y(n-1) \cdot X(n) - Y(n) \cdot X(n-1)$$

where Y(n) are the signal sample values 82 and X(n) are the expected sample values 80.

Figure 8B:
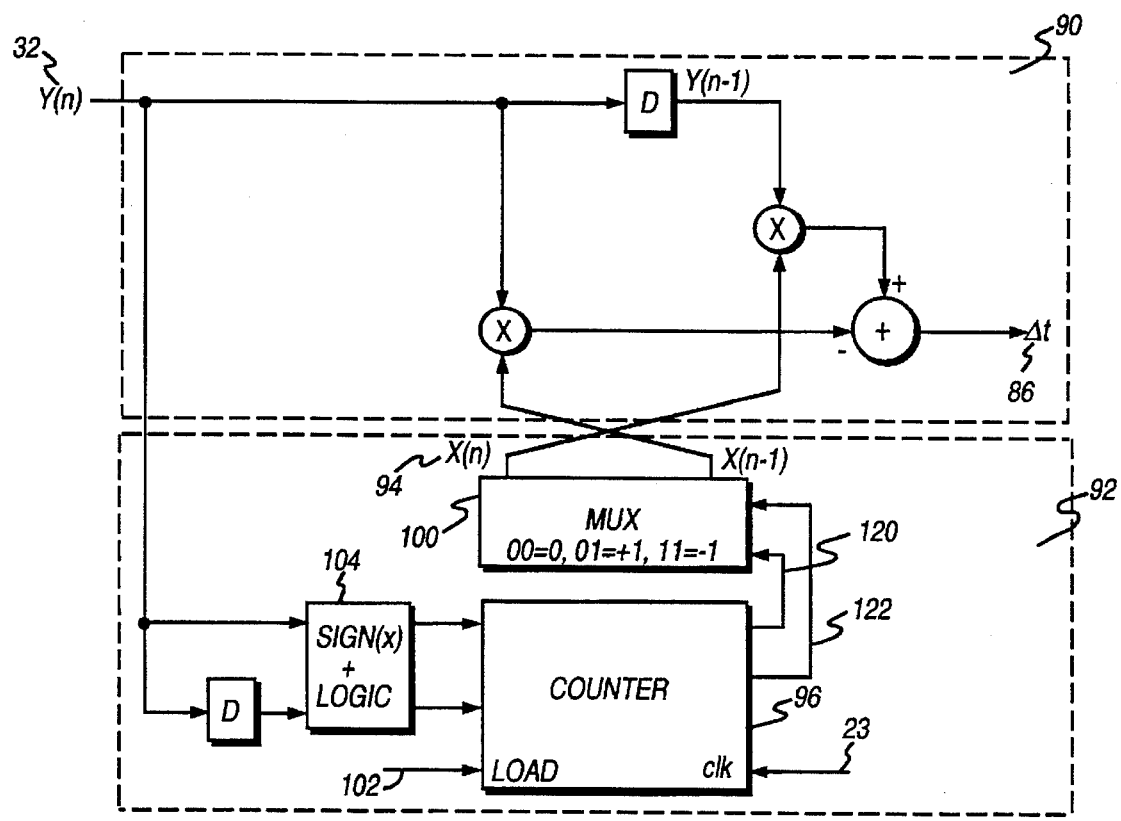
FIG. 8B shows, for side sampling, the circuit of the present invention for preventing the timing recovery from "hanging up" when the actual sampling time is halfway between the desired sampling times.

FIG. 8B shows the timing gradient circuit 90 for generating the timing gradient Δt 86, and a state machine 92 for generating the expected sample values X(n) 94 for the side-sampled preamble sequence. The expected samples X(n) 94 are generated by a state machine, rather than by using the signal sample values Y(n) 32, to avoid the "hang-up" problem when the sampling occurs at the point halfway between the desired sampling times (i.e., when τ=1/2T). Further, the state machine does not make errors in generating the expected sample values X(n) 94, therefore the preamble can be even shorter.

The preferred embodiment of the state machine 92 is a 2-bit counter 96. In side sampling mode, the output of the counter corresponds to the expected side-sampled preamble sequence:

00→+A, −A
01→−A, −A
10→−A, +A
11→+A, +A.

The expected sample value is scaled to |A|=1 so that the multipliers multiply by +1, −1 or 0. Thus, X(n) is two bits wide in order to represent the ternary values (00=0, 01=1, and 11=−1). Multiplexor 100 is responsive to the output of the counter 96 for selecting the expected sample values X(n) 94 which correspond to the current state. The counter 96 is loaded 102 with an initial starting state in response to the sign 104 of two consecutive sample values Y(n) 32. That is, the counter bits C0 120 and C1 122 are initialized to:

$$C1 = sgn(Y(n-1))$$

$$C0 = sgn(Y(n)) \text{ XOR } sgn(Y(n-1))$$

where sgn(x) returns a 1 if x is positive and 0 if negative. Table 1 shows the side-sampled starting state values loaded into the counter 96 corresponding to the two consecutive sample values.

TABLE 1

| State | Y(n − 1) | Y(n) | C1,C0 |
|---|---|---|---|
| +A,−A | +y | +y | 00 |
| −A,−A | +y | −y | 01 |
| −A,+A | −y | −y | 10 |
| +A,+A | −y | +y | 11 |

After the counter 96 is loaded with the initial starting state, it sequences through the states according to the expected samples in the 2T preamble at each sample clock 23. The four possible sequences are then:

(+A,−A,−A,+A,+A,−A, ... ); and
(−A,−A,+A,+A,−A,−A, ... ); and
(−A,+A,+A,−A,−A,+A, ... ); and
(+A,+A,−A,−A,+A,+A, ... ).

Once the decision to adjust the phase error in one direction has been made, the direction will not be reversed. Therefore, the "hang-up" problem inherent in prior art techniques is avoided.

Figure 9A:
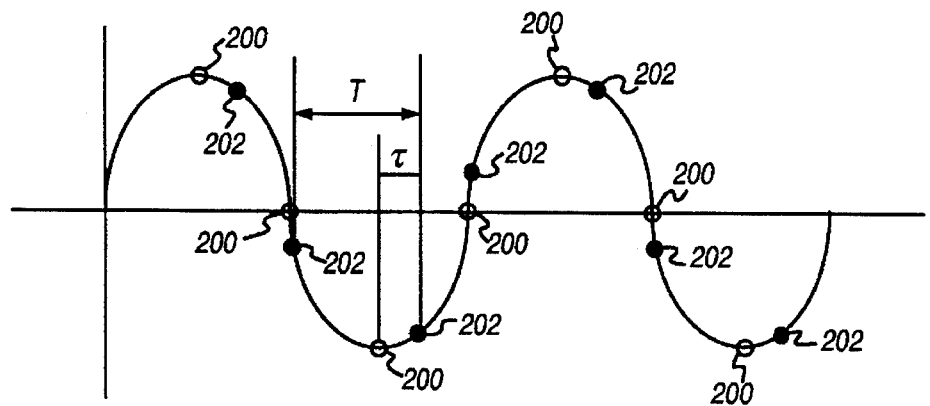
FIG. 9A shows center sampling of a 2T acquisition preamble and the phase error τ in the sampling frequency.
Figure 9B:
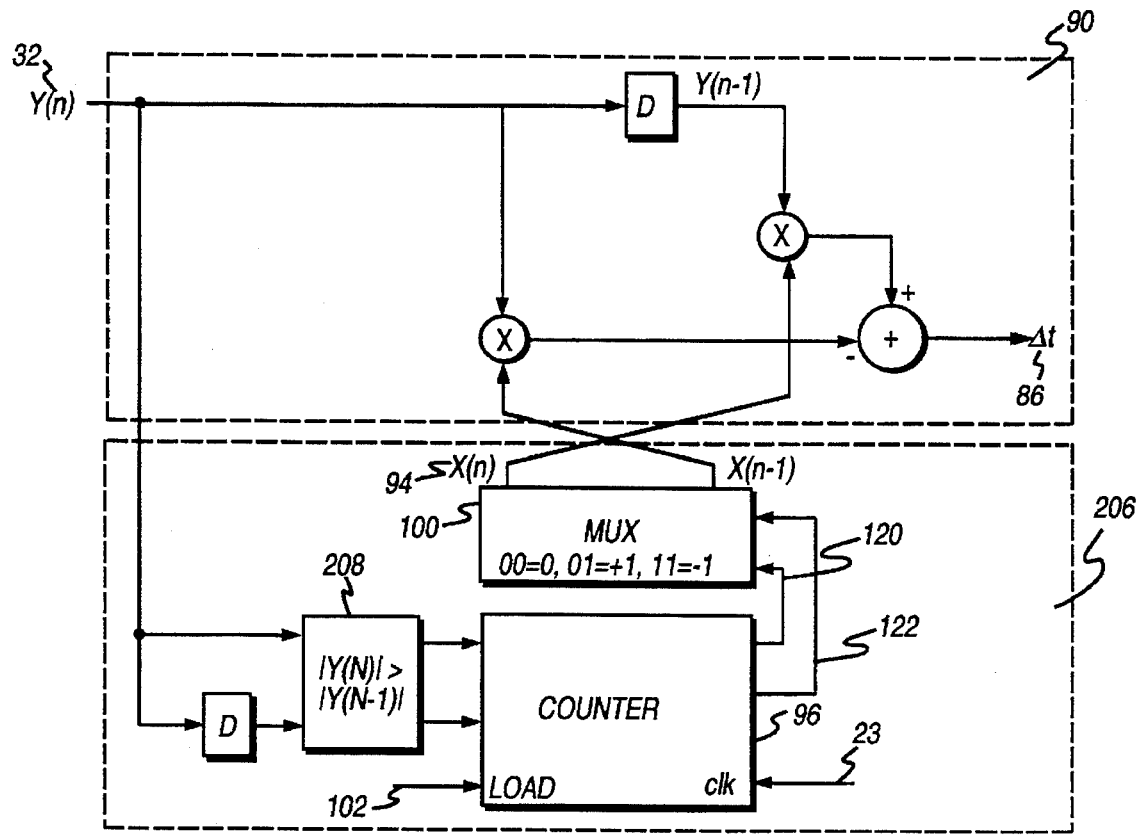
FIG. 9B shows, for center sampling, the circuit of the present invention for preventing the timing recovery from hanging up when the sampling time is halfway between the desired sampling times.

FIG. 9A shows the 2T preamble in center sample mode with the desired samples 200 in relation to the signal samples 202 and a corresponding phase error τ 204. FIG. 9B shows the center sampled timing gradient circuit 90 for generating the timing gradient Δt 86 and a state machine 92 for generating the expected sample values X(n) 94. The counter 96 generates the following states in center-sample mode:

00→0,−A
01→−A,0
10→0,+A
11→+A,0.

The counter 96 is initialized to a starting state in response to the sign and absolute magnitude 208 of two consecutive sample values Y(n) 32. That is, the counter bits C0 120 and C1 122 are initialized to:

$$C1 = ((|Y(n-1)| \triangleright |Y(n)|) \text{ AND } sgn(Y(n-1))) \text{ OR } ((|Y(n)| \triangleright |Y(n-1)|) \text{ AND } \overline{sgn(Y(n))})$$

$$C0 = (|Y(n)| \triangleright |Y(n-1)|)$$

where sgn(x) returns a 1 if x is positive and 0 if negative. Table 2 shows the center-sampled starting state values loaded into the counter 96, which correspond to the two consecutive sample values.

TABLE 2

| State | Y(n − 1) | Y(n) | C1,C0 |
|---|---|---|---|
| 0,−A | +Y | y | 00 |
| −A,0 | y | −Y | 01 |
| 0,+A | −Y | y | 10 |
| +A,0 | y | +Y | 11 |

In table 2, |Y|>|y|.

After the counter 96 is loaded with the initial starting state, it sequences through the states according to the expected samples in the 2T preamble at each sample clock 23. The four possible sequences are then:

(0,−A,0,+A,0,−A, ... ); and
(−A,0,+A,0,−A,0, ... ); and
(0, +A, 0,−A, 0,+A, ... ); and
(+A, 0,−A, 0, +A, 0, ... ).

Again, once the decision to adjust the phase error in one direction has been made, the direction will not be reversed, thereby avoiding the "hang-up" problem.

The state machine will continue to generate the expected samples corresponding to the 2T preamble for a predetermined number of sample clocks 23 after which the correct phase will likely be acquired. After the correct phase is acquired, timing recovery is switched into a tracking mode for processing arbitrary user data. The acquisition time is slightly less than the length of the 2T preamble so that the timing recovery is switched into tracking mode before the end of the 2T preamble is reached.

Figure 10:
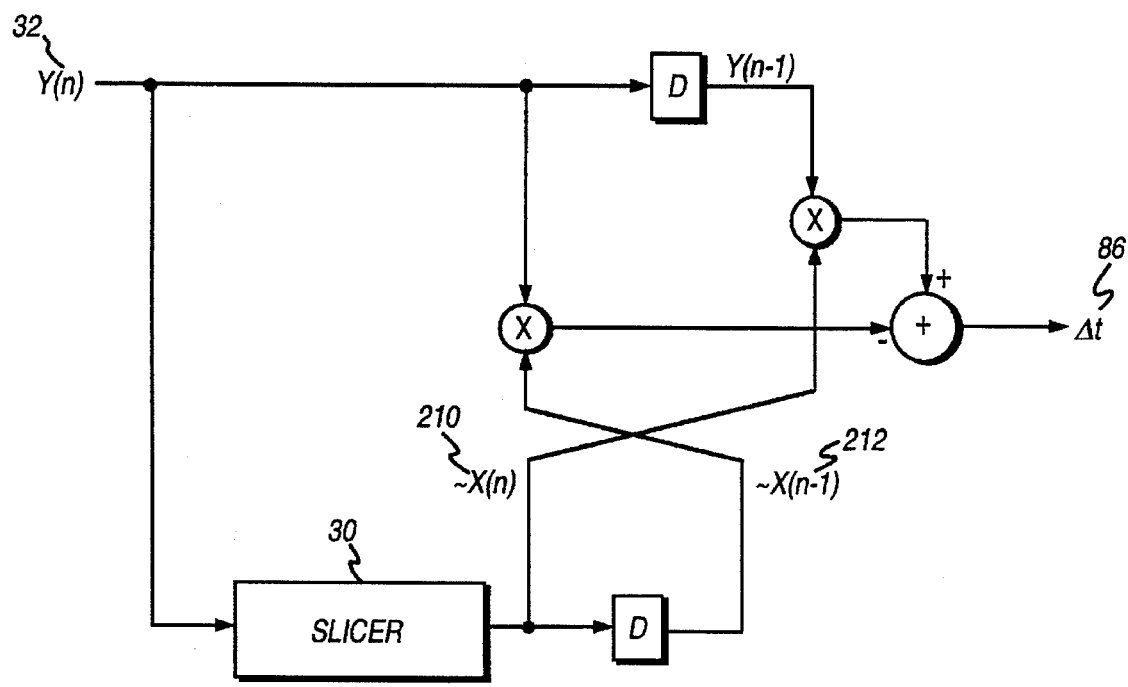
FIG. 10 shows the circuit of the present invention for generating the timing gradient when tracking arbitrary user data.

In tracking mode, the timing recovery is decision directed by estimated sample values, rather than state machine directed by expected sample values. A circuit for generating the timing gradient Δt in tracking mode is shown in FIG. 10. The timing gradient is computed as:

$$\Delta t(n) = Y(n-1) \cdot {\sim}X(n) - Y(n) \cdot {\sim}X(n-1)$$

where Y(n) 32 are the signal sample values and ~X(n) 210 are the estimated sample values. The estimated sample values ~X(n) 210 and ~X(n−1) 212 are computed by slicer 30 which operates on a sample-by-sample basis with no internal memory. The slicer 30 compares each sample to a programmable positive and negative threshold, and outputs a −1, 0, or +1 depending on the result. Table 3 shows the output of the slicer 30 corresponding to the current input sample.

TABLE 3

| Sample Value | Slicer Output |
| --- | --- |
| y >= T1 | +1 |
| −T2 <= y < T1 | 0 |
| y < −T2 | −1 |

In Table 3, y is the sample value and T1 and −T2 are the positive and negative thresholds, respectively.

The timing gradient Δt is computed by approximating the slope of the pulse signal at each sample instance. When processing arbitrary data, the error in the slope approximation varies, causing the gain of the timing gradient circuit to vary. To reduce this gain variance, the timing gradient Δt, computed as:

$$\Delta t(n) = Y(n-1) \cdot {\sim}X(n) - Y(n) \cdot {\sim}X(n-1),$$

is smoothed according to the following equation:

$$\Delta t(n) = 2 * \Delta t(n) \text{ if } {\sim}X(n) = 0 \text{ OR } {\sim}X(n-1) = 0;$$

and $$\Delta t = \Delta t(n-1) \text{ if } {\sim}X(n) = 0 \text{ AND } {\sim}X(n-1) = 0.$$

Figure 11:
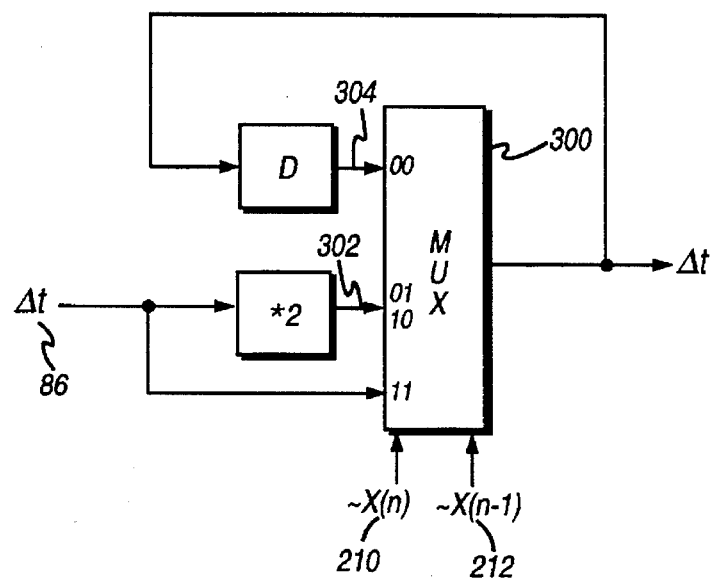
FIG. 11 is the timing gradient adjuster for reducing the variance in the gain of the timing recovery loop by smoothing the timing gradient when tracking arbitrary user data.

A circuit for implementing the smoothing equation is shown in FIG. 11. A multiplexer 300 selects Δt as:

$$2 * \Delta t \; 302 \text{ if } {\sim}X(n) 210 \text{ and } {\sim}X(n-1) 212 \text{ are } 01 \text{ or } 10;$$

and $$\Delta t(n-1) \; 304 \text{ if } {\sim}X(n) 210 \text{ and } {\sim}X(n-1) 212 \text{ are } 00;$$

and $$\Delta t \; 86 \text{ if } {\sim}X(n) 210 \text{ and } {\sim}X(n-1) 212 \text{ are } 11.$$

The objects of the invention have been fully realized through the embodiment disclosed herein. Those skilled in the art will appreciate that the aspects of the invention can be achieved through various embodiments without departing from the spirit and scope of the invention. The particular embodiment disclosed is illustrative and not meant to limit the scope of the invention as appropriately construed by the following claims.

We claim:

1. A timing recovery circuit in a synchronous read channel utilized in reading data from a magnetic medium, said synchronous read channel detects digital data from a sequence of discrete time sample values Y(n) generated by sampling pulses in an analog read signal from a magnetic read head positioned over the magnetic medium, said timing recovery circuit for adjusting a phase and frequency of a sampling clock signal relative to a phase and frequency of the pulses, said timing recovery circuit comprises a frequency error detector comprising:

(a) an input connected to receive the sample values Y(n); and (b) an output for outputting a frequency error $fe$ computed in response to three of the sample values Y(n), wherein;

the analog read signal is substantially periodic and the sample values Y(n) for computing the frequency error $fe$ span more than half of a period of the analog read signal; and The frequency error $fe$ is commuted proportional to:

$$sgn(Y(1)) \cdot (Y(4) - Y(0)) \text{ if } |Y(1)| > |Y(2)|;$$

and $$sgn(Y(2)) \cdot (Y(5) - Y(1)) \text{ if } |Y(1)| < |Y(2)|,$$

where the function sgn(x) returns the sign of the parameter x.

2. The timing recovery circuit as recited in claim 1, further comprising a variable frequency oscillator having said sampling clock signal as an output, wherein the variable frequency oscillator adjusts the frequency of the sampling clock in response to the frequency error $fe$.

3. A timing recovery method in a synchronous read channel utilized in reading data from a magnetic medium, said synchronous read channel detects digital data from a sequence of discrete time sample values Y(n) generated by sampling pulses in an analog read signal from a magnetic read head positioned over the magnetic medium, said timing recovery method for adjusting a phase and frequency of a sampling clock signal relative to a phase and frequency of the pulses, said timing recovery method comprises a frequency error detection method comprising the steps of:

(a) receiving the sample values Y(n); and (b) generating a frequency error signal $fe$ in response to three of the sample values Y(n), wherein;

the analog read signal is substantially periodic and the sample values Y(n) for computing the frequency error $fe$ span more than half of a period of the analog read signal; and the frequency error signal $fe$ is computed proportional to:

$$sgn(Y(1)) \cdot (Y(4) - Y(0)) \text{ if } |Y(1)| > |Y(2)|;$$

and $$sgn(Y(2)) \cdot (Y(5) - Y(1)) \text{ if } |Y(1)| < |Y(2)|,$$

wherein the function sgn(x) returns the sign of the parameter x.

4. The timing recovery method as recited in claim 3, further comprising the steps of:

(c) generating the sampling clock signal as the output of a variable frequency oscillator; and (d) adjusting the output of the variable frequency oscillator in response to the frequency error $fe$.

* * * * *